United States Patent
Umeki

(10) Patent No.: US 7,196,553 B2
(45) Date of Patent: *Mar. 27, 2007

(54) SENSOR SIGNAL DETECTION DEVICE

(75) Inventor: Nobuaki Umeki, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/348,374

(22) Filed: Feb. 7, 2006

(65) Prior Publication Data

US 2006/0125528 A1    Jun. 15, 2006

Related U.S. Application Data

(63) Continuation of application No. 10/879,758, filed on Jun. 30, 2004, now Pat. No. 7,026,844.

(30) Foreign Application Priority Data

Jul. 7, 2003    (JP) .............................. 2003-271278

(51) Int. Cl.
*H03K 5/153* (2006.01)

(52) U.S. Cl. ........................................ 327/74; 307/652

(58) Field of Classification Search .................. 327/74, 327/142, 143
See application file for complete search history.

(56) References Cited

U.S. PATENT DOCUMENTS

| | | | | |
|---|---|---|---|---|
| 3,836,790 A | * | 9/1974 | Becker | 327/74 |
| 4,446,427 A | * | 5/1984 | Lovrenich | 324/234 |
| 4,572,966 A | * | 2/1986 | Hepworth | 327/143 |
| 5,367,265 A | * | 11/1994 | Gaudette | 327/74 |
| 7,026,844 B2 | * | 4/2006 | Umeki | 327/74 |

FOREIGN PATENT DOCUMENTS

JP    2001-171344    6/2001

* cited by examiner

*Primary Examiner*—Long Nguyen
(74) *Attorney, Agent, or Firm*—Arent Fox PLLC

(57) ABSTRACT

The present invention provides a sensor signal detection device which allows the improvement of reliability. This sensor signal detection device comprises an internal power supply voltage generation circuit, a buffer amplifier for receiving signals from a sensor, a first pull-up element and pull-down element which are connected to an input terminal of the buffer amplifier via a first pair of switches, a gain amplifier for receiving output signals of the buffer amplifier, a second pull-up element and pull-down element which are connected to an input terminal of the gain amplifier via a second pair of switches, and a failure inspection circuit for inspecting buffer amplifier and gain amplifier by controlling the connection of the two pairs of switches in a predetermined sequence, and measuring the voltage at a predetermined location when power is started up.

10 Claims, 2 Drawing Sheets

SENSOR SIGNAL DETECTION DEVICE

REFERENCE TO RELATED APPLICATIONS

This is a Continuation of application Ser. No. 10/879,758 filed Jun. 30, 2004, now U.S. Pat. No. 7,026,844. The disclosure of the prior application is hereby incorporated by reference herein in its entirety.

BACKGROUND OF THE INVENTION

1. Field of the Invention

The present invention relates to a sensor signal detection device, for securing the safety of the human body, in industrial and vehicle equipment comprising a sensor.

2. Description of the Related Art

Industrial and vehicle equipment have used a sensor to prevent danger which harms the human body. In other words, when at least a part of the human body enters a dangerous area, the sensor detects this status, outputs the detection signal thereof to a sensor signal detection device, and the sensor signal detection device outputs a signal to stop or invert operation of the operating section of the equipment. According to Japanese Patent Application Laid-Open No. 2001-171344, for example, a cable type sensor is disposed at the door or window of an automobile, and when a hand is caught in an electric window, a pulse signal is generated at the core electrode of the cable type sensor, this signal is input into a sensor signal detection device, and is amplified and detected. Then this sensor signal detection device executes digital processing to output the signal to such a controller as a microcomputer, and the controller stops or inverts operation of the electric window to prevent danger to the human body.

SUMMARY OF THE INVENTION

As described above, equipment comprising a sensor requires a sensor signal detection device for detecting signals from the sensor, and very high reliability is demanded for the sensor signal detection device to insure safety to the human body.

Generally a failure inspection is performed to increase reliability for a device comprised of digital circuits before the device operates. Actually many of the devices themselves execute an initial test when power is started up. However with devices comprised of analog circuits, such as sensor signal detection devices, normally the devices themselves do not execute a failure inspection.

With the foregoing in view, it is an object of the present invention to provide a sensor signal detection device which allows the improvement of reliability.

To solve the above problems, a sensor signal detection device according to the present invention comprises: an internal power supply voltage generation circuit for generating internal power supply voltage from a power supply voltage; a first amplifier for receiving to an input terminal thereof positive and negative pulse signals from a sensor; a first pull-up element for pulling up the input terminal of the first amplifier to the internal power supply voltage side; a first pull-down element for pulling down the input terminal of the first amplifier to the ground potential side; a first pair of switches for electrically connecting the first pull-up element or pull-down element to the input terminal of the first amplifier; a second amplifier for receiving to an input terminal thereof output signals of the first amplifier; a second pull-up element for pulling up the input terminal of the second amplifier to the internal power supply voltage side; a second pull-down element for pulling down the input terminal of the second amplifier to the ground potential side; a second pair of switches for electrically connecting the second pull-up element or pull-down element to the input terminal of the second amplifier; and a failure inspection circuit for controlling the connection of the first and second pair of switches in a predetermined sequence and measuring voltage at a predetermined location when power supply is started up so as to inspect the first and second amplifiers.

This sensor signal detection device may further comprise a first window comparator for receiving to an input terminal thereof the output signals of the first amplifier, and a second window comparator for receiving to an input terminal thereof the output signals of the second amplifier, wherein the failure inspection circuit also inspects the first and second window comparators.

The sensor signal detection device of the present invention can improve reliability by disposing a failure inspection circuit for inspecting the failure of the first and second amplifiers by controlling the first and second pair of switches when power is started up, and confirming normal operation of the two analog circuits (first and second amplifiers) constituting the sensor signal detection device when power is started up.

DESCRIPTION OF THE PREFERRED EMBODIMENTS

Figure 1:
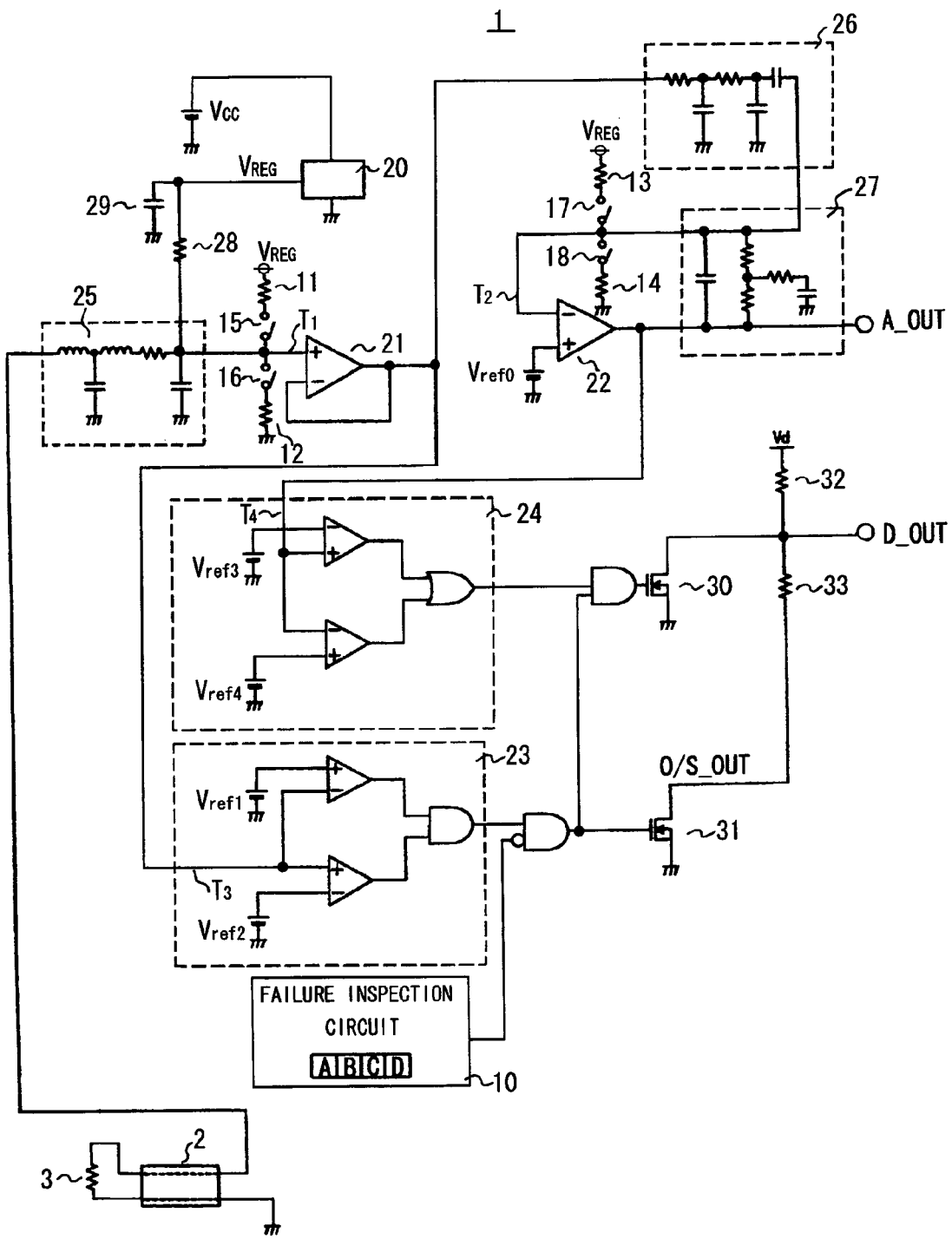
FIG. 1 is a circuit diagram depicting the sensor signal detection device according to an embodiment of the present invention.

Embodiments of the present invention will now be described with reference to the drawings. FIG. 1 is a diagram depicting the configuration of the sensor signal detection device 1 according to the embodiment of the present invention.

This sensor signal detection device 1 is comprised of an internal power supply voltage generation circuit 20 for generating the internal power supply voltage ($V_{REG}$) from the power supply voltage ($V_{CC}$), a buffer amplifier (first amplifier) 21 for receiving signals from a cable type sensor (sensor) 2 including a sensor resistance 3 to an input terminal $T_1$, a first pull-up resistance (first pull-up element) 11 which can forcibly pull-up this input terminal $T_1$ to the internal power supply voltage ($_{VREG}$) side, a first pull-down resistance (first pull-down element) 12 which can forcibly pull-down this input terminal $T_1$ to the ground potential side, a first pair of switches 15 and 16 for electrically connecting the first pull-up resistance 11 or the first pull-down resistance 12 to the input terminal $T_1$ of the buffer amplifier 21 when power is started up, a gain amplifier (second amplifier) 22 for receiving the output signals of the buffer amplifier 21 to the input terminal $T_2$, a second pull-up resistance (second pull-up element) 13 which can forcibly pull-up this input terminal $T_2$ to the internal power supply voltage ($V_{REG}$) side, a second pull-down resistance (second pull-down element) 14 which can forcibly pull-down this input terminal $T_2$ to the ground potential side, a second pair of switches 17 and 18 for electrically connecting the second pull-up resistance 13 or the second pull-down resistance 14 to the input terminal $T_2$ of the gain amplifier 22 when power is started up, a first window comparator 23 for receiving the output signals of the buffer amplifier 21 to the input terminal $T_3$, a second window comparator 24 for receiving the output signals of the gain amplifier 22 to the input terminal $T_4$, and a failure inspection circuit 10 for inspecting the startup of the internal power supply voltage ($V_{REG}$) when power is started up and controlling the first and second pairs of switches 15 and 16, 17 and 18 so as to inspect the failure of the buffer amplifier 21, gain amplifier 22, and the first and second window comparators 23 and 24.

In a more detailed description, the internal power supply voltage generation circuit 20 connects a capacitor 29, for smoothing the internal power supply voltage ($V_{REG}$), and a resistance 28 inserted in a space with the input terminal $T_1$ at the output side. This internal power supply voltage generation circuit 20 supplies the internal power supply voltage ($V_{REG}$) to the buffer amplifier 21, gain amplifier 22, and window comparators 23 and 24 and other components. Here the internal power supply voltage ($V_{REG}$) is set to about 5V. The resistance 28 and the sensor resistance 3 are set to an equal resistance value. Between the input terminal $T_1$ and the cable type sensor 2, a low pass filter 25 is inserted so as to remove high frequency noise from the output of the cable type sensor 2. In this case, the resistance value of the low pass filter 25 is sufficiently smaller than that of the resistance 28 and the sensor resistance 3.

The buffer amplifier 21 is a voltage follower type in the present embodiment, and the amplification factor is x1, but this magnification can be adjusted. The first pull-up resistance 11 and the pull-down resistance 12 must have a resistance value much smaller than that of the resistance 28, so in the present embodiment, it is assumed that the resistance value of the 28 is 10 MΩ, and that of the first pull-up resistance 11 and the pull-down resistance 12 are 100 kΩ.

The gain amplifier 22 is for inputting the output signals of the buffer amplifier 21 to the input terminal $T_2$ thereof, where the band-pass filter 26 is inserted between the input terminal $T_2$ and the output terminal of the buffer amplifier 21. This band-pass filter 26 allows only the signal band originally sensed by the cable type sensor 2 to pass. Between the output terminal of the gain amplifier 22 and the input terminal T2, the feedback circuit 27, for determining the amplification factor thereof, is inserted. To the other input terminal, the reference voltage ($V_{ref0}$) is input. The resistance value of the second pull-up resistance 13 and the pull-down resistance 14 is set to be much smaller than the resistance value of the feedback circuit 27. The output of this gain amplifier 22 becomes the analog signal output (A_OUT) of the sensor signal detection device 1.

The first window comparator 23 includes two comparators and an AND circuit to which the output of these comparators are input, and the output signals of the buffer amplifier 21 are input to one input terminal $T_3$ of the two comparators, and the high and low reference voltages ($V_{ref1}$, $V_{ref2}$) are input to the other input terminal of each comparator respectively. These high and low reference voltages ($V_{ref1}$, $V_{ref2}$) are set to about 3.5V and about 1.5V respectively. The second window comparator 24 includes two comparators and an OR circuit to which the output of these comparators is input, and the output signals of the gain amplifier 22 are input to one input terminal T4 of the two comparators, and the high and low reference voltages ($V_{ref3}$, $V_{ref4}$) are input to the other input terminal of each comparator. These high and low reference voltages ($V_{ref3}$, $V_{ref4}$) are set to a voltage when 0.5V is added to the reference voltage ($V_{ref0}$) and a voltage when 0.5V is subtracted from the reference voltage ($V_{ref0}$) respectively. And the sensor signal detection device 1 further comprises a transistor 31 which turns ON/OFF by an AND circuit to which the output signal of the first window comparator 23 and the inverted signal of the output of the failure inspection circuit 10 are input, and a transistor 30 which turns ON/OFF by an AND circuit to which the output signal of the above-mentioned AND circuit and the output signal of the second window comparator 24 are input. These transistors 30 and 31 are open-drain types, and the output (O/S_OUT) of the transistor 31 is connected to the output end of the transistor 30 via the resistance 33, and this output end becomes the digital signal output (D_OUT) of the sensor signal detection device 1. This digital signal output (D_OUT) is connected to the power supply (Vd) at the controller (not shown in the circuit diagram), such as a microcomputer which receives this signal, via the resistance 32.

The failure inspection circuit 10 controls the first and second pair of switches 15 and 16, 17 and 18 in the failure inspection flow when power is started up, and inspects the ON/OFF operation of the transistors 30 and 31. The failure inspection circuit 10 is comprised of four latch circuits A, B, C and D corresponding to the first and second pair of switches 15 and 16, 17 and 18, and outputs High level if one of the latch circuits A, B, C and D is in reset status, and outputs Low level if all of the latch circuits A, B, C and D are in set status. If all of the inspections are judged as normal (no failure locations) in the failure inspection flow when the power is started up, then all the latch circuits A, B, C and D become set status.

Now the operation of the sensor signal detection device 1 after power is started up (normal operation) will be described. Normal operation is performed after the later mentioned failure inspection flow at power ON if failure is not detected. At this time, the failure inspection circuit 10 outputs Low level, so as not to influence the operation of the other circuits.

In stable status of the normal operation, since the resistance 28 and the sensor resistance 3 have an equal resistance value and the resistance value of the low pass filter 25 is sufficiently small, the input terminal $T_1$ of the buffer amplifier 21 is maintained at an intermediate voltage (about 2.5V), and the output signal thereof is also maintained at the same voltage. Therefore the output signals in the range between the high and low reference voltages ($V_{ref1}$, $V_{ref2}$) are input to one input terminal $T_3$ of the two comparators of the first window comparator 23, so the transistor 31 is in ON status.

The input terminal $T_2$ of the gain amplifier 22, on the other hand, is maintained at the same voltage as the reference voltage ($V_{ref0}$), since the DC voltage of the output signals of the buffer amplifier 21 is filtered out by the band-pass filter 26, and the output thereof, that is the analog signal output (A_OUT), is also maintained at the same voltage. And in the window comparator 24, the high and low reference voltages ($V_{ref3}$, $V_{ref4}$) are set to a voltage when 0.5V is added to the reference voltage ($V_{ref0}$) and a voltage when 0.5V is subtracted from the reference voltage ($V_{ref0}$) respectively, so the transistor 30 is in OFF status. Therefore the digital signal output (D_OUT) is an intermediate voltage between the voltage of the power supply (Vd) and the ground potential, which are determined by the resistance 32 and the resistance 33.

When a part of a human body is in a dangerous area, that is when a hand or a finger is caught in an electric window of an automobile, for example, a pair of pulse signals, positive and negative, are input in sequence from the cable type sensor 2 to the buffer amplifier 21. In this case, the high frequency or the low frequency noise superimposed on the pulse signals is removed by the low pass filter 25 and the band pass filter 26, and the original pulse signals are amplified by the gain amplifier 22, and analog signal output (A_OUT) is output from the output terminal. If this analog signal output (A_OUT) becomes the reference voltage ($V_{ref3}$) or more or the reference voltage ($V_{ref0}$) or less, the transistor 30 becomes ON status by the output signal of the second window comparator 24, and the digital signal output (D_OUT) becomes ground potential.

The output voltage of the buffer amplifier 21 is the voltage before being amplified by the gain amplifier 22, and if this voltage becomes the reference voltage ($V_{ref1}$) or more or the reference voltage ($V_{ref2}$) or less, the transistors 30 and 31 both become OFF status by the output signal of the first window comparator 23, and the digital signal output (D_OUT) becomes the voltage of the power supply (Vd). In this case, the sensor signal detection device 1 notifies an abnormal status, in which the cable type sensor 2 is disconnected or shorted.

Figure 2:
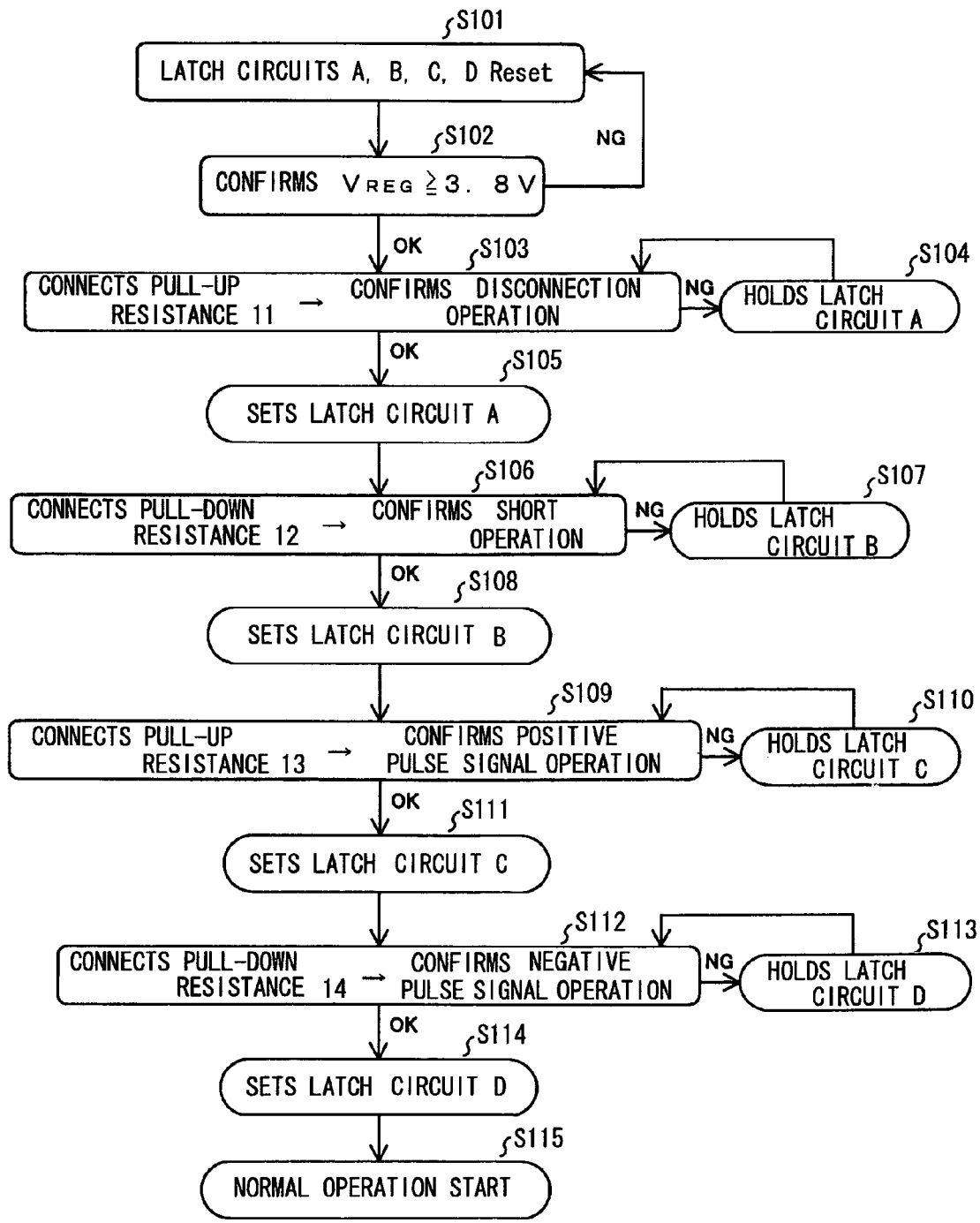
FIG. 2 is a flow chart depicting operation of the above sensor signal detection device when power is started up.

Now the failure inspection flow, which the failure inspection circuit 10 performs at power ON (when power is started up), will be described with reference to the flow chart in FIG. 2.

At first, the latch circuits A, B, C and D in the failure inspection circuit 10 are reset as initial status (S101). So the failure inspection circuit 10 outputs High level, the transistors 30 and 31 become OFF status, and the digital signal output (D_OUT) becomes the voltage of the power supply (Vd).

Now it is inspected whether the internal power supply voltage ($V_{REG}$) is an appropriate value (S102). The internal power supply voltage ($V_{REG}$) is set to 5V, but the lower limit voltage at which the buffer amplifier 21, gain amplifier 22 and window comparators 23 and 24 perform normal operation is assumed 3.8V or more, for example. If the internal power supply voltage ($V_{REG}$) is less then 3.8V (in the case of NG), this inspection is continued, and if it is 3.8V or more (in the case of OK), processing moves to the next inspection.

Then it is inspected whether the disconnection of the cable type sensor 2 can be detected, that is, whether the buffer amplifier 21 and the first window comparator 23 can operate to detect the disconnection (S103). This inspection is performed when closing the switch 15 of the first pair of switches 15 and 16 and pulling up the voltage of the input terminal $T_1$ of the buffer amplifier 21 by the first pull-up resistance 11. By this, voltage exceeding the high reference voltage ($V_{ref1}$) of the first window comparator 23 is output from the output terminal of the buffer amplifier 21, so the output signal of the first window comparator 23 becomes the same as the case when the cable type sensor 2 is shorted, that is, the output signal makes both the transistors 30 and 31 become OFF status. If this output signal cannot be detected, that is, if this inspection is not passed (in the case of NG), the latch circuit A stays as is (S104), and this inspection is continued. If this inspection is passed (in the case of OK), the latch circuit A is set (S105), and the next inspection is started.

Then it is inspected whether the short of the cable type sensor 2 can be detected, that is, whether the buffer amplifier 21 and the first window comparator 23 can detect the short (S106). This inspection is performed with closing the switch 16 of the first pair of switches 15 and 16 and pulling down the voltage of the input terminal $T_1$ of the buffer amplifier 21 by the first pull-down resistance 12. By this, voltage lower than the low reference voltage ($V_{ref2}$) of the first window comparator 23 is output from the output terminal of the buffer amplifier 21, so the output signal of the first window comparator 23 becomes the same as the case when the cable type sensor 2 is shorted, that is, the output signal makes both the transistors 30 and 31 become OFF status. If this output signal cannot be detected, that is, if this inspection is not passed (in the case of NG), the latch circuit B stays as is (S107), and this inspection is continued. If this inspection is passed (in the case of OK), the latch circuit B is set (S108), and the next inspection is started.

Then it is inspected whether the gain amplifier 22 and the second window comparator 24 operate normally when a positive pulse is input from the cable type sensor 2 to the sensor signal detection device 1 (S109). This inspection is performed by closing the switch 17 of the second pair of switches 17 and 18 and pulling up the voltage of the input terminal $T_2$ of the gain amplifier 22 by the second pull-up resistance 13. By this, voltage lower than the low reference voltage ($V_{ref4}$) of the second window comparator 24 is output from the output terminal of the gain amplifier 22, which is an inversion amplifier, so the output signal of the second window comparator 24 becomes the same as the case when a positive pulse is input from the cable type sensor 2. If this output signal cannot be detected, that is, if this inspection is not passed (in the case of NG), the latch circuit C stays as is (S110), and this inspection is continued. If this inspection is passed (in the case of OK), the latch circuit C is set (S11), and the next inspection is started.

Then it is inspected whether the gain amplifier 22 and the second window comparator 24 operate normally when a negative pulse is input from the cable type sensor 2 to the sensor signal detection device 1 (S112). This inspection is performed with closing the switch 18 of the second pair of switches 17 and 18 and pulling down the voltage of the input terminal $T_2$ of the gain amplifier 22 by the second pull-down resistance 14. By this, voltage higher than the high reference voltage ($V_{ref3}$) of the second window comparator 24 is output from the output terminal of the gain amplifier 22, so the output signal of the second window comparator 24 becomes the same as the case when a negative pulse is input from the cable type sensor 2. If this output signal cannot be detected, that is, if this inspection is not passed (in the case of NG), the latch circuit D stays as is (S113), and this inspection is continued. If this inspection is passed (in the case of OK), the latch circuit D is set (S114), and the failure inspection flow when power is started up ends.

If everything is normal (not judged as a failure) in the above failure inspection flow when power is started up, the latch circuits A, B, C and D all become set status, the failure inspection circuit 10 outputs Low level, and then the above mentioned normal operation is performed (S115). If an abnormality occurs (judged as a failure) in the failure inspection flow, one of the latch circuits A, B, C and D is in reset status, so the failure inspection circuit 10 continues the inspection in the status where High level is output.

Needless to say, the first pull-up resistance 11 and the pull-down resistance 12 can be replaced with elements which can forcibly change the voltage of the input terminal $T_1$ of the buffer amplifier 21, such as a constant current source. This is the same for the second pull-up resistance 13 and the pull-down resistance 14. The first pair of switches 15 and 16 need not be installed between the first pull-up resistance 11 or the pull-down resistance 12 and the input terminal $T_1$ of the buffer amplifier 21 only if the connection and disconnection of current can be controlled. This is the same for the second pair of switches 17 and 18.

In the present embodiment, the sensor signal detection device 1 has a digital signal output (D_OUT) function, but in the case of a device having only an analog signal output (A_OUT) function, the sensor signal detection device need not comprise the first and second window comparators 23 and 24, and the output of the buffer amplifier 21 and the gain amplifier 22 may be directly inspected by the failure inspection circuit 10.

The present invention is not limited to the above mentioned embodiment, but various design changes are possible within the scope of the claims.

What is claimed is:

1. A signal detection device, comprising:
   an internal power supply voltage generation circuit for generating an internal power supply voltage from a power supply voltage;
   an input circuit for receiving at an input terminal thereof pulse signals;
   a first pull-up element for pulling up the input terminal of the input circuit to the internal power supply voltage;
   a first pull-down element for pulling down the input terminal of the input circuit to a ground potential;
   a first pair of switches for electrically connecting the first pull-up element or first pull-down element to the input terminal of the input circuit;
   an amplifier for receiving at an input terminal thereof output signals of the input circuit;
   a second pull-up element for pulling up the input terminal of the amplifier to the internal power supply voltage;
   a second pull-down element for pulling down the input terminal of the amplifier to the ground potential;
   a second pair of switches for electrically connecting the second pull-up element or second pull-down element to the input terminal of the amplifier; and
   a failure inspection circuit for controlling the connection of said first and second pair of switches in a predetermined sequence and measuring the internal power supply voltage when power supply is started up, so as to inspect said input circuit and said amplifier.

2. The signal detection device according to claim 1, wherein said failure inspection circuit includes latch circuits corresponding to said first and second pair of switches.

3. The signal detection device according to claim 2, wherein the latch circuits of said failure inspection circuit are reset as initial status when power supply is started up.

4. The signal detection device according to claim 3, wherein said failure inspection circuit measures the internal power supply voltage, and then controls the connection of said first and second pair of switches and sets the corresponding latch circuits in a predetermined sequence.

5. The signal detection device according to claim 1, wherein said input circuit is another amplifier.

6. The sensor signal detection device according to claim 5, wherein the amplification factor of said input circuit is x1.

7. The sensor signal detection device according to claim 1, further comprising:
   a first window comparator for receiving at an input terminal thereof the output signals of said input circuit; and
   a second window comparator for receiving at an input terminal thereof the output signals of said amplifier,
   wherein said failure inspection circuit also inspects the first and second window comparators.

8. The signal detection device according to claim 1, wherein a low pass filter is located prior to the input terminal of said input circuit.

9. The signal detection device according to claim 1, wherein a band-pass filter is inserted between the input terminal of said amplifier and the output terminal of said input circuit.

10. The signal detection device according to claim 1, wherein the amplification factor of said amplifier is determined by a feedback circuit inserted between the output terminal and input terminal thereof.

* * * * *